United States Patent
Heliö

(10) Patent No.: US 7,653,168 B2
(45) Date of Patent: Jan. 26, 2010

(54) DIGITAL CLOCK DIVIDING CIRCUIT

(75) Inventor: Petri Heliö, Tampere (FI)

(73) Assignee: Nokia Corporation, Espoo (FI)

( * ) Notice: Subject to any disclaimer, the term of this patent is extended or adjusted under 35 U.S.C. 154(b) by 502 days.

(21) Appl. No.: 11/034,633

(22) Filed: Jan. 12, 2005

(65) Prior Publication Data

US 2006/0156049 A1 Jul. 13, 2006

(51) Int. Cl.
*H03D 3/24* (2006.01)

(52) U.S. Cl. .................. 375/373; 375/371; 375/376; 375/354

(58) Field of Classification Search ............. 375/354, 375/359, 371, 373, 376; 327/100, 141, 144, 327/147, 156, 165, 166, 291, 297

See application file for complete search history.

(56) References Cited

U.S. PATENT DOCUMENTS

| | | | | |
|---|---|---|---|---|
| 4,164,688 A | * | 8/1979 | Cushing | 315/389 |
| 4,926,445 A | * | 5/1990 | Robb | 375/354 |
| 5,017,810 A | * | 5/1991 | Nakano et al. | 326/38 |
| 5,103,185 A | * | 4/1992 | Arai | 327/292 |
| 5,231,313 A | | 7/1993 | Itoh | 307/480 |
| 5,339,345 A | * | 8/1994 | Mote, Jr. | 377/48 |
| 5,614,869 A | * | 3/1997 | Bland | 331/1 A |
| 5,754,063 A | * | 5/1998 | Lee | 327/18 |
| 6,356,123 B1 | * | 3/2002 | Lee et al. | 327/115 |
| 6,501,313 B2 | * | 12/2002 | Boerstler et al. | 327/175 |
| 6,995,589 B2 | * | 2/2006 | Chen et al. | 327/117 |
| 7,272,620 B1 | * | 9/2007 | Molnar et al. | 708/103 |
| 2002/0097075 A1 | * | 7/2002 | Ono et al. | 327/175 |
| 2003/0151441 A1 | * | 8/2003 | Neff | 327/295 |
| 2004/0160247 A1 | * | 8/2004 | Magoon et al. | 327/115 |
| 2005/0265483 A1 | * | 12/2005 | Erdogan | 375/316 |
| 2005/0285655 A1 | * | 12/2005 | Komura | 327/295 |

FOREIGN PATENT DOCUMENTS

| | | |
|---|---|---|
| EP | 0453171 A2 | 10/1991 |
| WO | WO-00/31885 A1 | 6/2000 |

* cited by examiner

*Primary Examiner*—Shuwang Liu
*Assistant Examiner*—Kenneth Lam
(74) *Attorney, Agent, or Firm*—Harrington & Smith, PC

(57) ABSTRACT

Disclosed is a digital dividing circuit for dividing a timing signal. Memory elements are disposed in opposed pairs at opposed sides of a data loop. Each memory element is clocked to change the data bit it stores on each clock pulse. At least two opposed nodes along the data loop are coupled to one another by a memory content check MCC sub-circuit. The MCC checks for a desired relation between nodes. If the desired relation exists, then data values and phases rotate a step around the data loop during each clock cycle. If the desired relation does not exist, then the data value on one node is used to correct the data value on the opposed node so to achieve the desired relation. The clock signal is divided based on the number of memory elements around the data loop, and some or all pairs of opposed memory elements may be coupled through the MCC.

13 Claims, 3 Drawing Sheets

DIGITAL CLOCK DIVIDING CIRCUIT

FIELD OF THE INVENTION

The present invention relates to logical circuits for dividing a clock signal such that an output on a node is changeable less than once per clock cycle.

BACKGROUND

The vast majority of digital logic circuits require a clock signal to operate in cooperation with other circuits. This is especially true in modern telecommunications where signal sampling, channel feedback parameters, and information used to despread and decode a transmitted message are all highly dependent upon precise timing among devices. In the telecommunications realm, the changeover from analog to digital is generally described as moving the converter (analog to digital for transmitting, and digital to analog for receiving) as close as possible to the antenna, close meaning in the electronic pathway sense. As electronic sub-systems have become digitized, they are increasingly being integrated in fabricated circuit chips. Pure complementary metal-oxide semiconductor (CMOS) processes are becoming standard platforms for an increasing number of applications, including hardware for radio-frequency (RF) communications. Linewidths of the CMOS silicon processes continue to shrink as engineers learn to manipulate wafer fabrication with more precision. This results in more densely packed devices on a single chip, increasing electronic speed while decreasing physical size of implementing electronics and reducing chip costs.

One electronic bottleneck in RF ASICs has been generation of clock signals at a frequency less than that output by a high frequency oscillator. Many different processes within any individual electronic device—for example, sampling and decoding processes of a mobile station—must operate synchronously for seamless real-time communications. A single system clock is therefore desirable to maintain synchronous operation among the different sub-circuits, though those sub-circuits may operate at different clock speeds. Synchronous operation is obtained by dividing the system clock signal for those sub-circuits operating at less than the oscillator frequency. For example, co-owned International Patent Publication No. WO 00/31885, published on Jun. 2, 2000 and concerning RF signal processing in a radio telecommunication system, describes a divider that is used to divide a synthesizer signal so that received mixing signal corresponds to the selected frequency receive band. That reference is incorporated herein by reference for a particularly apt environment for the present invention, as detailed below. For example, a 4 GHz synthesizer may enable the same receiver to receive transmissions in the 2 GHz band or the 1 GHz band by dividing either by two or four, respectively. During transmission in the same system, that published application describes a similar function for a divider.

Analog dividers are known in the art, but occupy a large physical space and draw a large amount of power, both disadvantages for mobile telephony equipment. They often require some biasing to be functional, and are generally more sensitive to process variations. Conversely, classic digital dividers suffer from signal asymmetry, where the clock signal divider has outputs that are not balanced in phase (balanced being either matching or opposing phases). Digital clock dividers have also exhibited high noise, have imposed delays in signal processing, and typically draw a large current as compared to other more processing-intense circuits. For the above reasons, clock division continues to represent a bottleneck in the 'digital revolution'.

One well-known prior art circuit 20 to digitally divide a clock signal is shown in FIG. 1. A clock signal 22 drives a clocked memory element 24 (CME). The CME 24 lies within a data loop 26 with an inverter 28. First 30 and second 32 output nodes along the data loop 26 are labeled 30 and 32, respectively. The CME is, for example, a flip-flop circuit, where the rising edge of the clock pulse causes the data bit stored in the flip flop to be output and the falling edge of the same clock pulse causes the next data bit to be input and stored within. The inverter is a simple logic gate, generally implemented in CMOS via transistors. The designator "M" represents the data bit stored in the CME 24 of FIG. 1. Assume high and low data states of 1 and 0, respectively, where an initial data bit (e.g., following a first falling edge of the clock) stored in the CME 24 is high (1). Upon the next rising edge of the clock, the high bit (1) is output from the CME 24 and lies on the first output node 30, and is input into the inverter 28 where it is changed to low (0) and output to lay on the second output node 32. At the next falling edge of the clock, the low bit (0) is input into the CME 24 from the second node 32, and the bits at the first 30 and second 32 nodes remain unchanged. At the next rising edge of the clock, the low data bit (0) from the CME 24 is output to the first node 30, and also inverted at the inverter 28 to lie on the second node 32 as a high bit (1).

The following truth table shows the above results and make clear that the output on either the first or second node is at one half the rate of the clock signal. By using several clocked memory elements 24, the division factor can be increased from 2 to any multiple of 2 (i.e. 4, 6, 8 . . . ). Odd divisions like 3, 5, 7 etc. can be-obtained by using more sophisticated feedback logic. However, there are inherent disadvantages to the circuit of FIG. 1. Following each of the rising edges of clock pulses, there is a delay in inverting node 30 with the inverter 28, resulting in the outputs at the first and second nodes (30&32) being out of phase with one another. (i.e. the first rising edge of the clock changes the $1^{st}$ node from 0 to 1 and the second rising edge changes the $1^{st}$ node from 1 to 0; and so on. So two rising edges of the input clock cause only one rising edge (0 to 1) at the output clock, which means that the output clock is divided by two.

| Clock pulse | CME | 1st node | 2nd node |
| --- | --- | --- | --- |
| First Falling Edge | 1 | | |
| First Rising Edge | | 1 | 0 |
| Second Falling Edge | 0 | | |
| Second Rising Edge | | 0 | 1 |

What is needed in the art is a circuit and method to digitally divide a clock signal that is low in noise, low in power consumption, adaptable to divide the clock signal by any fraction, and that keeps a phase relationship between various outputs of the circuit. Such a circuit would be particularly advantageous if it also operated without imposing circuit delays in real time signal processing of mobile telecommunications, and if it were made from circuit devices already used and readily fabricated.

SUMMARY OF THE INVENTION

This invention is in one aspect a method of digitally dividing a clocking signal. In the method, at least a first and a second clocked memory element CME are disposed in series along a data loop. A clocking signal is applied to each of the first and second CMEs, though each may operate on different clock edges of the overall clocking signal. Further in the method, a relation between digital values stored in the first and second CME is checked, which may be the value of the stored digital values, the phase, or both. A signal is output from the data loop at a frequency less than the clocking signal.

In another aspect, the present invention is a digital clock dividing circuit that has a data loop along which is disposed first and second output nodes, and first and second clocked memory elements CMEs. The output nodes may be disposed between the CMEs or may be the data storage of the CMEs themselves. The first and second CMEs are in series with one another, each having an input that is coupled to an output of the other CME along the data loop. Several or numerous other pairs of CMEs may also be disposed along the data loop to achieve different integer divisors, with or without additional output nodes. The circuit further has a clock that itself has a cyclical output that is input into each of the first and second CMEs, though it may not be the same output (e.g., different clock edges from the same clock to the different CMEs). A sub-circuit between the CMEs defines a pathway, separate from the data loop, that has first and second ends coupled to the first and second nodes. The sub-circuit is for checking, once or on each clock cycle (which includes continuously monitoring), a digital value stored in the first CME against a digital value stored in the second CME. The checking may be one way or is preferably bi-directional to cross-check the stored digital values against one another. In some instances, it is preferable that the sub-circuit check on each clock pulse. Preferably, four CMEs are disposed along the data loop and four output nodes are coupled in opposed pairs via a memory content check sub-circuit.

In another aspect, the present invention is a wireless radio transceiver that has an antenna coupled to a mixer, and a synthesizer having an oscillator coupled to a phase locked loop. An output of the synthesizer is coupled to an input of the mixer, and the phase locked loop has a feedback loop. The feedback loop has a digital divider circuit. That digital divider circuit has at least two opposed clocked memory units coupled to one another along a data loop. Each of the memory units has an input coupled to an output of the oscillator. The divider circuit further has a memory check circuit providing a pathway, separate from the data loop, by which a data value at a first node along the data loop may be checked against a data value at a second node along the data loop.

In yet another aspect of the present invention is a wireless radio transceiver having an antenna coupled to a mixer, and an oscillator having an output coupled to an input of the mixer through a digital divider circuit. The digital divider circuit has at least two opposed clocked memory units coupled to one another along a data loop, and each of the memory units has an input coupled to an output of the oscillator. The divider circuit further has a memory check circuit providing a pathway, separate from the data loop, by which a data value at a first node along the data loop may be checked against a data value at a second node along the data loop.

In another aspect, the present invention is a direct conversion wireless radio transceiver having an antenna for receiving an RF signal, a mixer having an input coupled to the antenna, and an oscillator in series with a dividing circuit for providing a frequency signal to the mixer that corresponds to a carrier frequency of the RF signal. In this aspect, the improvement includes the dividing circuit having at least two opposed clocked memory units coupled to one another along a data loop. Each of the memory units has an input coupled to an output of the oscillator. The dividing circuit further has a memory check circuit that has a pathway, separate from the data loop, by which a data value at a first node along the data loop may be checked against a data value at a second node along the data loop.

In another aspect, the present invention is a digital clock divider circuit that includes a plurality of clocked inverters disposed in series with one another about a data loop. Each clocked inverter along the data loop operates on one of a positive or negative clock edge that differs from that clock edge on which each adjacent clocked inverter operates. The novel circuit further includes a memory check sub-circuit that is coupled between outputs of two non-adjacent clocked inverters. These non-adjacent clocked inverters each operate on a common clock edge. The memory check sub-circuit is for comparing outputs of those non-adjacent clocked inverters.

In another aspect, the present invention is a method for dividing an input clock signal. This method includes applying a clock signal to a series of memory elements that are disposed in series with one another about a data loop. On each edge of the clock signal, a first data bit is moved along the series of memory elements, a value of that first data bit is inverted on each clock edge, and a phase of that first data bit is shifted on each clock edge. Further in the method, the value of the first data bit is checked against a value of a second data bit that is moving along the series of memory elements at a separate portion of the data loop. This checking may or may not occur on a clock edge, and may occur only at initial powering on of the circuit, depending upon the particular implementation. In any implementation, the first data bit is output when it reaches an output node along the data loop. Even with only two memory elements disposed along the circuit, the data bits output at the output node is at half the rate of the clock signal. Depending upon the extent of the circuitry, the rate may be one fourth that of the clock signal, one eighth, and so forth.

These and other features, aspects, and advantages of embodiments of the present invention will become apparent with reference to the following description in conjunction with the accompanying drawings. It is to be understood, however, that the drawings are designed solely for the purposes of illustration and not as a definition of the limits of the invention.

DETAILED DESCRIPTION

The following acronyms are used in this disclosure:

| | |
|---|---|
| ASIC | Application Specific Integrated Circuit |
| Clk(P/N) | Clock (Positive edge/Negative edge) |
| CME | Clocked Memory Element |
| CMOS | Complementary Metal-Oxide Semiconductor |
| IC | Integrated Circuit |
| IP, IN | In-phase signals (Positive and Negative) |

-continued

| | |
|---|---|
| IV | Inverter |
| IT | Tri-state Inverter |
| LO | Local Oscillator |
| M | Memory |
| MCC | Memory Content Check circuit |
| N | Negative |
| P | Positive |
| QP, QN | Quadrature signals (Positive and Negative) |

Figure 1:
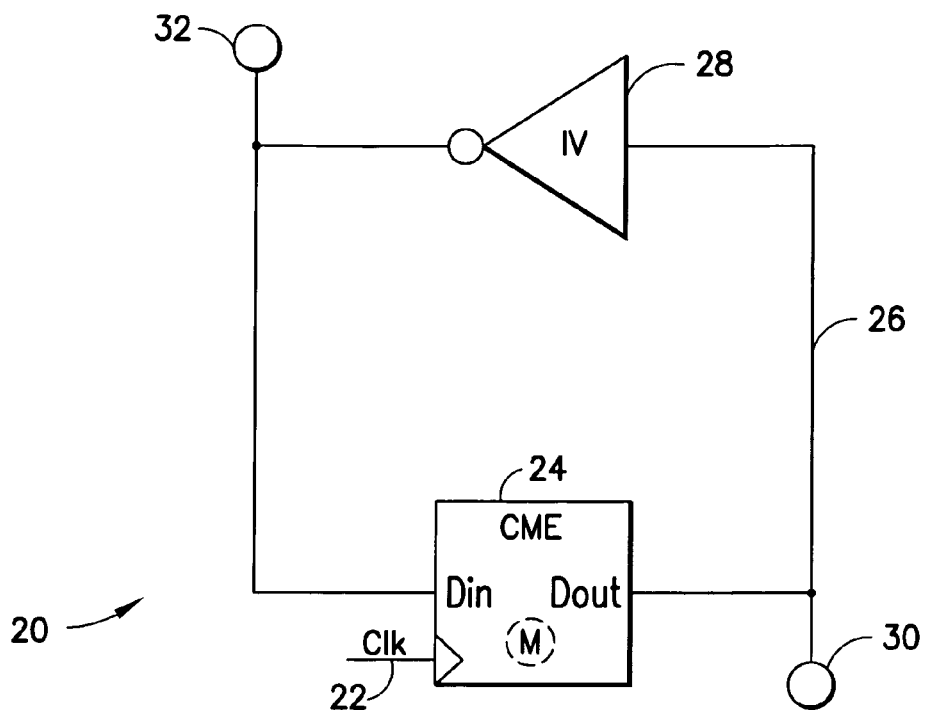
FIG. 1 is a circuit-level diagram of a prior art clock divider.
Figure 2:
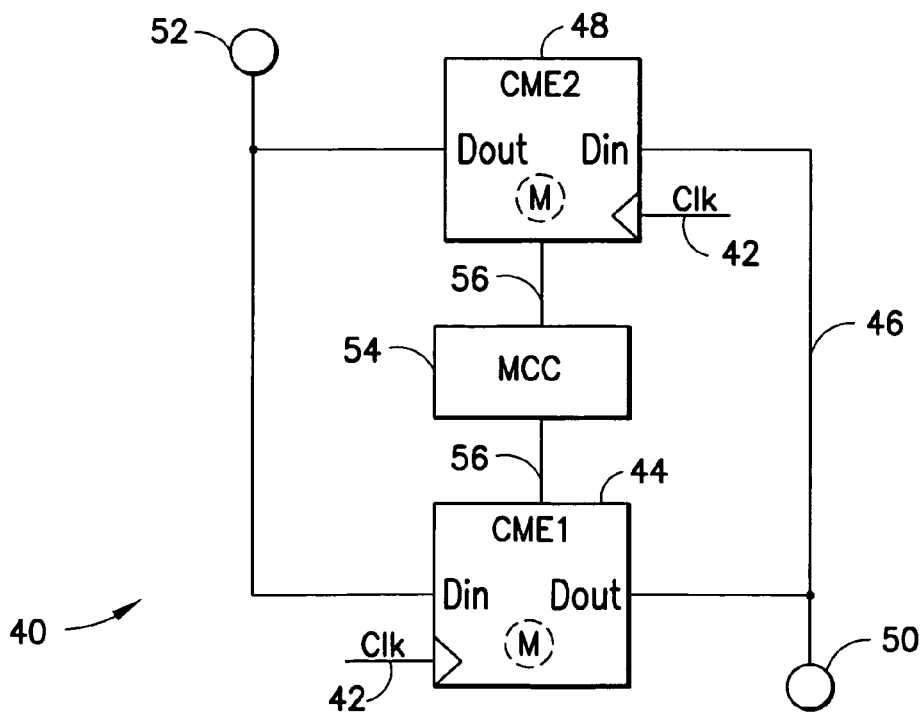
FIG. 2 is a circuit level diagram of a clock divider according to the preferred embodiment of the present invention for dividing a signal by two.

FIG. 2 is a circuit level diagram of a clock divider circuit 40 according to the preferred embodiment of the present invention. A clock signal 42 is input into each of a first 44 and a second 48 clocked memory element, CME1 (44) and CME2 (48), respectively. A memory element is an electronic circuit element that can store a discrete piece of information, and a CME has a clock as an input so that different pieces of information are stored based on a clock signal. The first 44 and second 48 memory elements are disposed along a data loop 46, which defines a first 50 and a second 52 node at which outputs may be drawn that are clocked at a rate less than that of the input clock signal 42. In the circuit of FIG. 2, as with the prior art circuit of FIG. 1, the output signal at each node 50, 52 is at half the rate of the input clock signal 42. Disposed between the memory elements 44, 48 is a memory content check block (MCC) 54, which is a circuit detailed below and with respect to FIG. 3, which is exemplary of the invention and not exhaustive. It is notable that the MCC 54 does not lay along the data loop 46, but couples to each of the CMEs 44, 48 along a separate pathway 56. That separate pathway 56 is identifiable in that it does not couple to any output node 50, 52 except through a CME 44, 48. The data loop 46 is identifiable in that it couples an output of one CME 44, 48 to the input of another CME 48, 44, and also provides the data to the output nodes 50, 52. It is notable that in FIG. 2, data is latched into memory with one clock (e.g. a negative clock edge) and the other clock (e.g. the positive clock edge) transfers data from memory to the output (i.e. nodes 50,52).

In accordance with the preferred embodiment of the present invention, the data loop 46 includes only clocked memory elements 44, 48. Instead of a discrete inverter 28 as in FIG. 1, data output from one clocked memory element 44 is inverted with another clocked memory element. Within the memory content check block 54, the content of the CMEs 44, 48 are checked so that the inversion function is obtained. In other words, the MCC 54 compares and checks a data bit in one CME 44 to a data bit in another CME 48.

Figure 3:
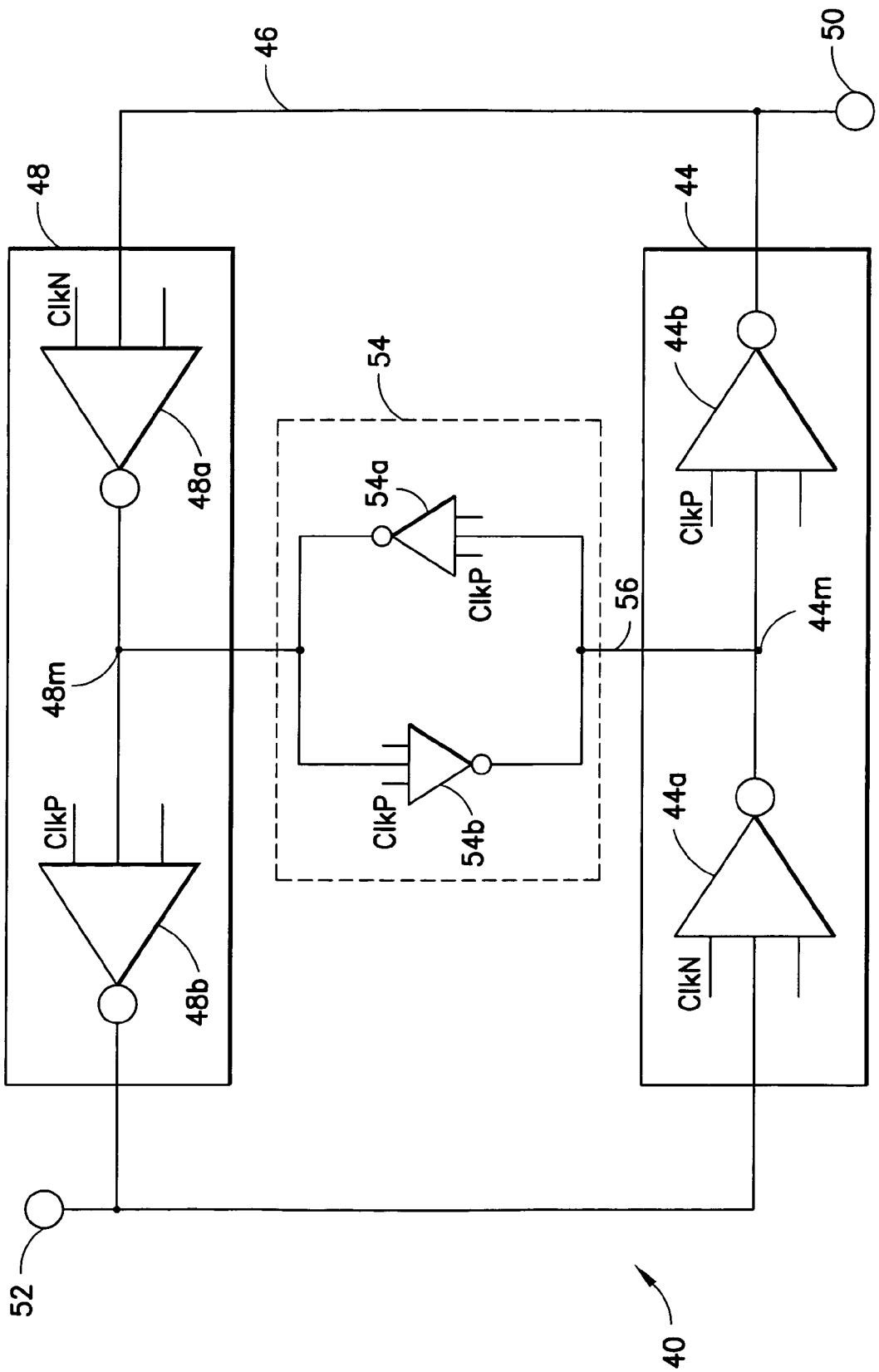
FIG. 3 is a circuit-level diagram of FIG. 2 showing one implementation of the memory content check circuit.

FIG. 3 is a circuit-level diagram similar to that of FIG. 2, but showing the circuit 40 with one implementation of the memory content check sub-circuit 54. The CMEs 44 and 48 are each a pair of tri-state inverters (44a/44b and 48a/48b) with the data bit M stored between them. Each tri-state inverter of the CMEs 44, 48 operates in conjunction with one of the positive and negative clock edges [Clk(P) and Clk(N), respectively]. Each tri-state inverter of the CMEs 44, 48 clock their input data bit (stored between the pairs of inverters 44a/44b and 48a/48b) into the nearest forward output node (node 50 for CME1, 44; and node 52 for CME2, 48).

The memory content check sub-circuit MCC 54 couples opposed pairs of CMEs 44, 48 to one another along a separate pathway 56 apart from the data pathway 46. In each direction along that separate pathway is another tri-state inverter 54a, 54b that operates to confirm that the data bit stored in the first CME 44 is opposite that stored in the second CME 48. The data bit stored in the CME 44, 48 is locked at this point due to the high impedance state of the tri-state inverters 44a, 48a of the CMEs 44, 48, depending upon the clock edge. The locked data bits from opposing CMEs 44 48 are checked against one another with the clocked tri-state inverters 54a, 54b of the memory content check sub-circuit 54. In this manner, the circuit 40 is forced to have a mode where the digital stages are looping so that the data stored in opposite CMEs 44, 48 are always in different states.

Operation of the circuit 40 of FIG. 3 is as follows. Assuming that a data bit within a first tri-state inverter 44 is stored at node 44m, a data bit within a second tri-state inverter 48 is stored at node 48m, and initially a high data bit lies at the first output node 50 and a low data bit lies at the second output node 52. At a first clock edge, which is negative, the high data bit of the first output node 50 is inverted at inverter 48a and lies as a low data bit at node 48m. On that same negative clock edge, the low data bit of the second output node 52 is inverted at inverter 44a and lies as a high data bit at node 44m. On the following clock edge, which is positive, the high data bit at node 44m is inverted at inverter 54a and the low data bit at node 48m is inverted at inverter 54b. The output of one MCC inverter 54a is a low data bit that then lies within the second CME at node 48m, which was the same data bit value at that same node immediately preceding the current positive clock edge, thereby checking the data in one direction. The output of the other MCC inverter 54b is a high data bit that then lies within the first CME at node 44m, which was the same data bit value at that same node immediately preceding the current positive clock edge, thereby checking the data in the opposite direction. It is noted that here, the MCC operates at the rising edge as described above—but also the CMEs 44b and 48b operate at the rising edge. So the data is checked at the same time that the output changes. On the same rising edge, the high data bit from the node 44m is inverted at inverter 44b and lies at the first output node 50 as a low data bit. Simultaneously, the low data bit from the node 48m is inverted at inverter 44b and lies at the second output node 52 as a high data bit. Two full clock cycles expire before the first output node 50 again carries another low data bit, and two full clock cycles expire before the second output node again carries a high data bit. The effective clock rate is halved, and data between the CMEs 44 and 48 is checked at the MCC 54 on each positive clock edge. As depicted, each inverter is actuated only on one clock edge of each clock pulse, not both. For example, in FIG. 3 the inverters 44a and 48a operate on the negative clock edge and all others operate on the positive edge. While all inverters may have each clock edge input, during a particular mode of operation each is actuated only with one clock edge per clock cycle. Further, for each inverter along the data loop 46, each consecutive inverter is actuated on the clock edge opposite form that of its adjacent inverters along the loop 46. The inverters 54a, 54b of the MCC in FIG. 3 (those inverters within a single MCC loop) operate on the same clock edge.

Figure 4:
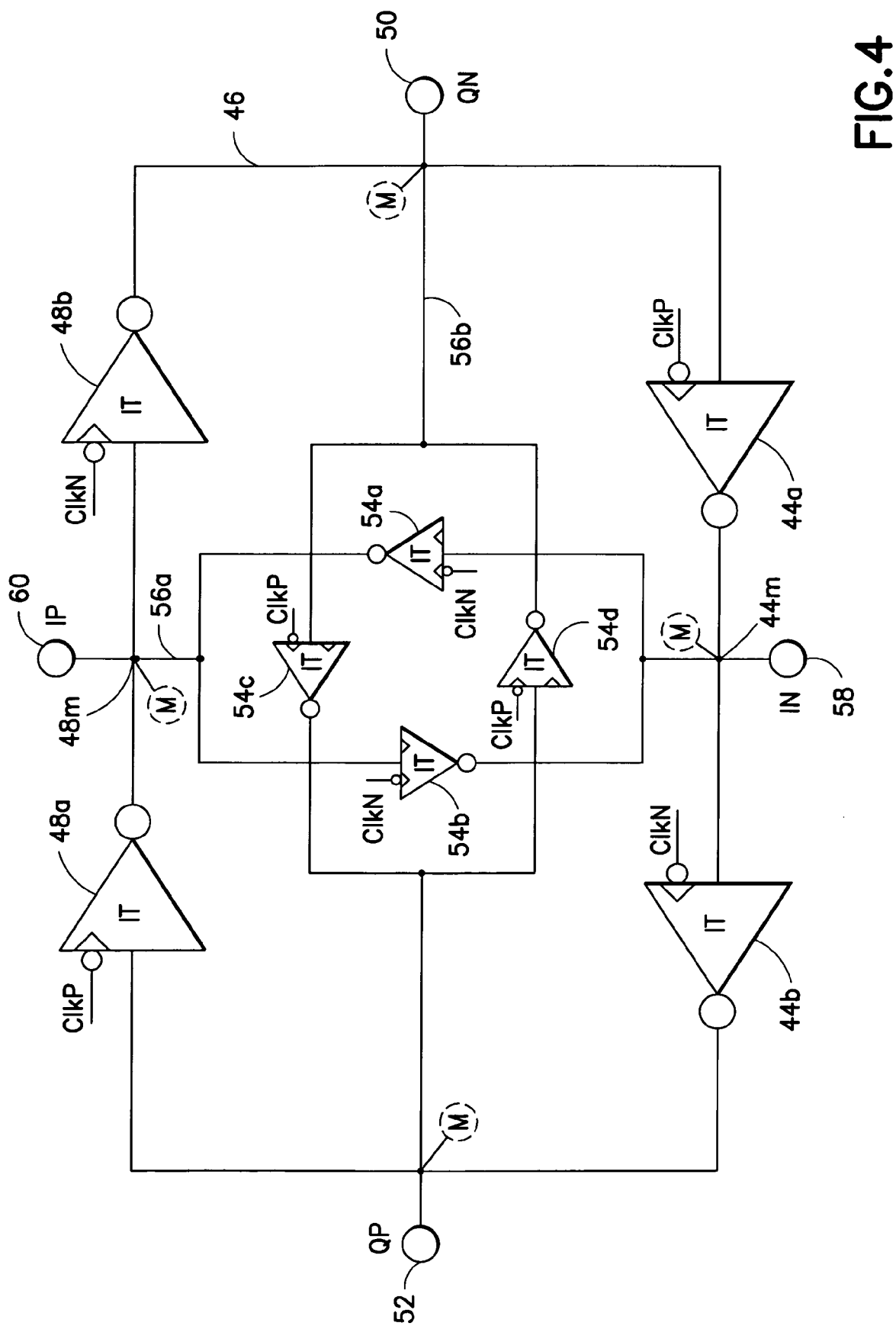
FIG. 4 is a similar to FIG. 3 but having symmetric checking circuit loops.

FIG. 4 is similar to FIG. 3 but having four output nodes and the MCC 54 adapted to check between each opposing pairs of nodes. Like reference numbers indicate like components previously described, and FIG. 4 is the preferred embodiment for a divide-by-two implementation of the inventive circuit 40. For those inverters of FIG. 4 that replicate those of FIG. 3, the operative clock edge is reversed to show flexibility in design. Added to the previously detailed circuit 40 is a second separate pathway 56b along which a third 54c and fourth 54d tri-state inverter are disposed, each along one direction of current flow. These remain within the MCC 54. This second separate pathway 56b couples the first 50 and second 52 output nodes previously described, though these are now quadrature output nodes having, for example, data values QN and QP lying on them at a given instant. What was previously described as the data bit stored within the CMEs 44, 48 between the pairs of tri-state inverters 44*a*/44*b*, 48*a*/48*b*, is now modified to also constitute third 58 and fourth 60 output nodes, respectively. These are the in-phase nodes carrying, at a given time instant, opposed in-phase data values IN and IP, respectively. One portion of the memory content check sub-circuit 54, that having the third 54*c* and fourth 54*d* tri-state inverters along the second separate pathway 56*b*, checks that the data along the quadrature output nodes 50, 52 are opposite in value. The other portion of the memory content check sub-circuit MCC 54, that having the first 54*a* and second 54*b* tri-state inverters along the first separate pathway 56*a*, checks that the data along the in-phase output nodes 58, 60 are opposite in value.

There will lie different states at the opposite memory nodes, so that, for example, the third 58 and fourth 60 nodes are at opposing values (e.g., 1 and 0) and in phase with one another; and the first 50 and second 52 nodes are also at opposing values and in phase with one another. An important aspect of this implementation is that the first and second nodes 50, 52 are opposite in phase from the third and fourth nodes 58, 60. The quadrature signals (QP and QN) are clocked with different clock edges as compared to the in phase signals (IP and IN). As depicted, the first and second nodes 50 (QN) and 52 (QP) obtain a new quadrature-phase value on a positive clock edge, whereas the third and fourth nodes 58 (IN) and 60 (IP) obtain a new in-phase value on a negative clock edge. This leads to the result that each output is timewise divided by two, and all outputs are in different phase (e.g. QP is delayed by 90-degrees (quadrature signal) compared to IP, because in phase and quadrature outputs are triggered with different clocks. Specifically, QP is delayed by 90-degrees compared to IP; IN is delayed by 90-degrees compared to QP; QN is delayed by 90-degrees compared to IN; and finally, (full 360-degrees) IP is delayed by 90 degrees compared to QN.

Operation of FIG. 4 is now described. Assume an initial state of a low data bit at the first output node 50 (QN) and a high data bit at the second output node 52 (QP), each at a phase Q, and a negative clock edge triggered (ClkN) embodiment. At the first positive clock edge, the low data value from QN is inverted at 44*a* and lies at the third output node 58 (IN) as a high data value at a phase I that is 90° removed from the Q phase of node QN. On that same positive clock edge, the high data value from the second output node 52 (QP) is inverted at 48*a* and lies on the fourth node 60 (IP) as a low data value with phase I, that is also 90° removed from the Q phase of node QP. On the following negative clock edge, the high data value with phase I from the third node 58 is inverted at 54*a* and compares favorably with the low data value at the fourth node 60. The same occurs in the opposing direction along the first separate data path 56*a*. At this point, the data lying on the first node 50 is high with phase Q, and the data lying on the second node is low with phase Q. On the next positive clock edge, the second separate data path 56*b* is employed to favorably compare the data values of the first 50 and second 52 output nodes, with 54*c* and 53*d*. The inverters 54*a*, 54*b* that check the in-phase data values (IN and IP) operate on a clock edge opposite that of the inverters 54*c*, 54*d* that check the quadrature phase data values (QN and QP). At each output node, the value of the data bit may change but the phase remains the same. It is clear from the above that the data values move in a loop along the data pathway 46, changing phase and value at each output node. Opposed pairs of output nodes are checked via the MCC 54 to ensure that opposite data values of the same phase lie at opposite sides of the separate pathways 56*a*, 56*b*. Each output node is synchronously changing at half of the input clock frequency.

The novel divider described here may be considered as rotating the data like a carousel. Input clocks [ClkN, ClkP] are used to rotate the carousel synchronously. These input clocks can be considered as driving the carousel, giving more speed (energy) to carousel rotation. Outputs are at nodes along the periphery carousel, the data loop 46. This carousel is only rotating data values that move along a circuit structure, so their relative distance between one another may change and any of the outputs along the periphery may lag or streak ahead of the average carousel movement. The memory content check sub-circuit (MCC) can be considered to be a conduit through the center of the carousel, moving extra energy to a lagging portion of the carousel and/or taking energy from a streaking portion. Continuous memory content checking operates as a rotation corrector, keeping the separate (specifically, the opposing) data values at the same phase and speed relative to one another. In some applications, it may be advantageous to perform memory content checking only at startup or initial powering up of the divider circuit 40. If the data pathway 46, CMEs, and output nodes are set correctly at the startup, memory looping starts also in this case and should remain stable over long periods for most anticipated operating conditions. The MCC can also be configured such that it is active only when the "carousel" corners start to be too slow/fast, as detailed below.

If checking through the MCC 54 fails, the failing memory nodes are adjusted so that they have the wanted states. One easy memory check can be e.g. that if the memory state of a certain clocked data node in a feed-forward path is one value, then the memory state in the corresponding feedback memory node (the node opposite the first and coupled to it through an MCC pathway) must be an inversion of memory state in the feed-forward data node. The opposite of course holds true, and is enabled by either of the bi-directional separate pathways 56*a*, 56*b*: the feed-forward memory content must be the inversion of the feedback memory content. Because the circuit 40 of the present invention performs only memory checks rather than memory inversions on each clock cycle, its operation is more efficient in power consumption, symmetrical in that opposed nodes carry identical phase, and faster in that less circuitry is involved as compared to prior art digital dividers (considering that the MCC circuit 54 imposes a speed penalty only when it actively changes a data value in a CME). The present invention also helps to move the digital logic further towards the antenna of a mobile station, allowing more components to be digital.

Whereas FIGS. 3 and 4 describe divide-by-two circuits, they may be readily extended to circuits that divide by 2n (n being any positive integer) by adding additional pairs of opposed clocked memory elements along the data loop 46, and coupling the opposed CMEs via a separate pathway 56 through a memory content check sub-circuit 54. Not every pair of opposed CMEs need necessarily be coupled to one another through the memory content check sub-circuit; some precision may be lost but a divide-by-four circuit may include four CMEs along the data pathway 46 and a memory content check sub-circuit 54 that couples two of them. Divide by four (or more) can also be achieved by cascading two divide by two circuits such as those particularly described. For example in FIG. 4 outputs IP and IN are used to clock the next divide by two circuit (ClkP and ClkN). It is also possible to build single divide by four circuit as noted above, but cascading two divide by two circuits is deemed a more practical implementation because the cascaded circuit operates only at half the speed of a non-cascaded circuit and therefore operates with less current, and important consideration for mobile stations or any device operating with a galvanic power source.

The MCC 54 may include different logic circuitry than that shown in FIGS. 3-4. For example, opposed data values may be compared at an AND gate and a correction made if the output is other than a digital '1' (in a system using only '0' and '1' as data values). Similar implementations may be had with a NAND gate, a NOR gate, an OR gate, or various combinations thereof. The tri-state inverters shown and described are deemed the best mode, but many others are available. The individual logic gates within the memory content check sub-circuit 54 may be clocked or unclocked, differential or single-ended. Instead of tri-state inverters, the CMEs can be also formed with pure inverters followed by transmission gate—the functionality is the same.

The MCC can be used in any kind of divider circuit. In mobile telephony circuitry, even-numbered divisions of clock signals with differential IQ-outputs are needed in up- and down mixing. The IQ-divider divides a voltage-controlled oscillator signal suitable for up- and down mixers. However, by using more complex MCC circuitry, odd-numbered division (e.g., divide-by-three) and multi-ratio dividers (e.g. divide by 4 or 5) as in a predivider in a phase locked loop, can be built. In the predivider case, however, symmetry in the output signal (differential IQ-signal) is not as critical as in mixing for certain cellular handsets, so the MCC 54 need not couple every opposed pair of CMEs.

The MCC topology enables very efficient dividers. For example, in the case of symmetrical divide-by-2 topology shown in FIG. 4, the divider main data loop 46 consists only of four tri-state inverters. In operation, there is only one tri-state inverter per division phase (IP, IN, QP, QN). This arrangement uses fewer components for symmetric differential outputs, yielding a more efficient implementation, less intrinsic noise, and lower power consumption. Performance is further improved if memory checking is arranged so that it is active (e.g., the MCC changes a data value in a CME) only when needed, when opposed pairs of CMEs do not carry opposed data values and common phase. This is done using simple digital circuitry (e.g., NOR and NAND gates) in the MCC sub-circuit 54.

At the present, the inventor deems the best mode for the present invention as shown in FIG. 4 when used as an I-Q divider, such as blocks 11 and 12 of International Patent Publication No. WO 00/31885 (previously cited). It may also be used in the feedback loop of the block-illustrated phase locked loop of the synthesizer 10 of the receiver illustrated in FIG. 2 of that publication. In that latter implementation, the divider may include a prescaler with fixed division followed by a programmable divider.

Digital dividers can sometimes be well buried inside the digital logic of an overall integrated circuit, so visually they may be difficult to recognize from a circuit layout. Implementation of the divider main data loop 46 preferably has only clocked memory elements (tri-state inverters (IT) or inverters (IV) followed by transmission gate (TG)). Implementation of memory context checking sub-circuit 54 that is needed for the divider main data loop 46 to work properly may vary.

The present invention is particularly advantageous in multi-band transceiver for next generation mobile phones. However, it is in general a very efficient way of doing signal division, and can be used in several applications.

While there has been illustrated and described what is at present considered to be preferred and alternative embodiments of the claimed invention, it will be appreciated that numerous changes and modifications are likely to occur to those skilled in the art. It is intended in the appended claims to cover all those changes and modifications that fall within the spirit and scope of the claimed invention.

What is claimed is:

1. A method comprising:
   applying a clocking signal to each of: a first clocked memory element, a second clocked memory element, a third clocked memory element and a fourth clocked memory element,
   where the first clocked memory element, the second clocked memory element, the third clocked memory element and the fourth clocked memory element are connected in series in a closed data loop, where an output of the first clocked memory element is directly connected to an input of the second clocked memory element, an output of the second clocked memory element is directly connected to an input of the third clocked memory element, an output of the third clocked memory element is directly connected to an input of the fourth clocked memory element, and an output of the fourth clocked memory element is directly connected to the input of the first clocked memory element;
   checking a relation between digital values stored in the first clocked memory element, the second clocked memory element, the third clocked memory element and the fourth clocked memory element; and
   outputting a signal from the loop at a frequency less than the clocking signal;
   wherein checking the relation between digital values stored in the third clocked memory element and the fourth clocked memory element occurs on one of: a rising clock edge and a falling clock edge, and checking a relation between digital values stored in the first clocked memory element and the second clocked memory element occurs on the other of: the rising clock edge and the falling clock edge.

2. The method of claim 1 wherein checking a relation between digital values stored in the first clocked memory element and the second clocked memory element comprises checking that the digital values are opposite in value.

3. The method of claim 1 wherein checking the relation between digital values stored in the first clocked memory element and the second clocked memory element comprises checking the digital value of the first clocked memory element against the digital value of the second clocked memory element on one of: a rising clock edge and a falling clock edge, and further comprises checking the digital value of the second clocked memory element against the digital value of the first clocked memory element on the said one of: the rising clock edge and the falling clock edge.

4. The method of claim 1 wherein the checking occurs continuously.

5. The method of claim 1 further comprising:
   in the case wherein checking the relation results in finding that a desired relation does not exist, using the digital value stored in one of the first clocked memory element and the second clocked memory element to change the digital value at the other of the first clocked memory element and the second clocked memory element.

6. A method comprising:
   applying a clocking signal to each of: a first clocked memory element and a second clocked memory element,
   where the first clocked memory element and the second clocked memory element are connected in series in a closed data loop, where an output of the first clocked memory element is directly connected to an input of the second clocked memory element and an output of the second clocked memory element is directly connected to an input of the first clocked memory element;
checking a relation between digital values stored in the first clocked memory element and the second clocked memory element; and
outputting a signal from the data loop at a frequency less than the clocking signal,
wherein checking the relation between digital values stored in the first clocked memory element and the second clocked memory element comprises checking that a phase of the digital values are identical.

7. The method of claim 6, where applying the clocking signal comprises applying the clocking signal to each of: the first clocked memory element, the second clocked memory element, the third clocked memory element and the fourth clocked memory element; and
checking the relation further comprises checking that the digital values stored in the first clocked memory element and the second clocked memory element are opposite in phase from the digital values stored in the third clocked memory element and the fourth clocked memory element.

8. A circuit comprising:
a data loop defining a first output node and a second output node;
a first clocked memory element and a second clocked memory element clocked memory element each having an input connected to an output of the other along the data loop;
a third node defined by the first clocked memory element and a fourth node defined by the second clocked memory element;
a clock having a cyclical output that is input into each of: the first clocked memory element and the second clocked memory element;
a sub-circuit comprising a first pathway separate from the data loop having a first end and a second end connected to the first clocked memory element and the second clocked memory element for checking digital values stored in the first clocked memory element and the second clocked memory element against one another; and a second pathway separate from the data loop having a first end and a second end connected to the third node and the fourth node for checking a digital value at the third node against a digital value at the fourth node.

9. The circuit of claim 8, wherein the sub-circuit is further for changing a digital value at the first clocked memory element by replacing it with a version of the digital value stored in the second clocked memory element.

10. The circuit of claim 8 wherein the sub-circuit comprises at least one inverter along the separate pathway.

11. The circuit of claim 10 wherein the sub-circuit comprises two clocked inverters in series with one another along a data check loop, each of said clocked inverters operating on a common clock edge.

12. The circuit of claim 8 wherein each of: the first clocked memory element and the second clocked memory element comprise a pair of clocked inverters in series with one another, each of said pair of clocked inverters operating on a different clock edge.

13. The circuit of claim 8 disposed on an integrated circuit chip of a mobile phone.

* * * * *